(12) United States Patent
Hoffmann et al.

(10) Patent No.: US 6,430,057 B1
(45) Date of Patent: Aug. 6, 2002

(54) DEVICE FOR INTERFACING AN INTEGRATED CIRCUIT CHIP WITH A PRINTED CIRCUIT BOARD

(75) Inventors: Martin Nordhoff Hoffmann, Shelton; Mamatha D. R. Naidu, Durham, both of CT (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/641,172

(22) Filed: Aug. 17, 2000

(51) Int. Cl.[7] .................... H05K 7/12; H05K 1/00; H05K 12/00
(52) U.S. Cl. ................................ 361/767; 439/69
(58) Field of Search ............. 439/68–75; 361/807–810, 361/767, 7, 783; 257/698, 701

(56) References Cited

U.S. PATENT DOCUMENTS

| | | | |
|---|---|---|---|
| 4,646,132 A | 2/1987 | Kuwabara et al. | |
| 5,061,989 A | * 10/1991 | Yen et al. | 257/692 |
| 5,290,193 A | * 3/1994 | Goff et al. | 439/73 X |
| 5,294,829 A | 3/1994 | Hundt | |
| 5,460,531 A | * 10/1995 | Vivio | 439/70 |
| 5,688,128 A | 11/1997 | Ikeya | |
| 5,712,768 A | * 1/1998 | Werther | 439/75 X |
| 5,816,828 A | 10/1998 | Ikeya et al. | |
| 5,881,453 A | 3/1999 | Avery et al. | |
| 5,973,928 A | * 10/1999 | Blasi et al. | 361/760 |
| 6,007,357 A | 12/1999 | Perino et al. | |
| 6,069,481 A | 5/2000 | Matsumura | |

* cited by examiner

Primary Examiner—Brian Sircus
Assistant Examiner—Son Nguyen
(74) Attorney, Agent, or Firm—Dilworth & Barrese

(57) ABSTRACT

A device is provided for structurally and electrically interfacing an integrated circuit (IC) chip with a printed circuit board (PCB) designed for another IC chip, where the two IC chips have different structural and/or electrical operating characteristics. The device provides structural and/or electrical interfaces for interfacing the IC chip with the PCB.

28 Claims, 3 Drawing Sheets ic chip 100 on the top surface of the IC chip carrier assembly 12.

DEVICE FOR INTERFACING AN INTEGRATED CIRCUIT CHIP WITH A PRINTED CIRCUIT BOARD

BACKGROUND OF THE INVENTION

1. Field of the Invention

The present invention relates generally to the field of integrated circuit (IC) design, and more particularly, to a device for interfacing an IC chip with a printed circuit board (PCB) designed for another IC chip, where the two IC chips have different structural configurations and/or electrical operating characteristics.

2. Description of the Related Art

Integrated circuit (IC) design engineers are constantly designing and improving the performance and efficiency of integrated circuit (IC) chips. As these engineers design new high performance IC chips having a smaller surface area than their original counterparts, printed circuit board (PCB) manufacturers are compelled to redesign their existing PCBs to modify the structural and/or electrical interfaces built thereon in order to interface the PCBs with the new high performance IC chips. Accordingly, PCB manufacturers are faced with redesign costs every several months or years when a new IC chip is fabricated to replace an older IC chip.

The PCB redesign procedure generally includes redesigning the PCB to interface with the structural configurations and/or electrical operating characteristics of the new IC chip. Additionally, the PCB is typically modified to "fit" the new IC device, since the new IC device generally has a different shape and/or a smaller surface area than the original IC chip.

In an effort to keep PCB redesign costs at a minimum, adapter systems have been implemented to match the structural configurations of the new IC chip with the structural configurations of the PCB. These systems typically suffer from a common drawback in that they only match the structural configurations of the new IC chip with the PCB. If the electrical operating characteristics of the new IC chip are different than the IC chip being replaced, then these adapter systems are ineffective in interfacing the new IC chip with the PCB.

Accordingly, there exists a need for a device for matching dissimilar structural configurations and/or electrical operating characteristics of a new IC chip with a PCB designed for another IC device. Such a device can incorporate a new IC chip to a PCB designed for another IC chip, without requiring a redesign of the PCB.

SUMMARY OF THE INVENTION

It is an object of this disclosure to provide a device for interfacing an integrated circuit (IC) chip with a printed circuit board (PCB), i.e., an IC chip replacement device, which provides both a structural and electrical interface between an IC chip and a PCB designed for use with another IC chip ("original IC chip"), where the IC chip and the original IC chip have different structural configurations and/or electrical operating characteristics.

The IC chip replacement device of the present invention is capable of replacing an older IC chip mounted on a PCB with a new IC chip by interfacing the structural and electrical interfaces of the PCB with the new IC chip. For example, in one aspect of the present disclosure, the IC chip replacement device of the present invention is configured for replacing an older IC chip having a specific operating voltage and mounted on a PCB with a new IC chip having different a operating voltage.

Accordingly, the structural and electrical interfaces provided by the IC chip replacement device advantageously precludes the need to redesign the PCB to accommodate the new IC chip.

BRIEF DESCRIPTION OF THE DRAWINGS

The foregoing features of the present invention will become more readily apparent and may be understood by referring to the following detailed description of an illustrative embodiment of the present invention, taken in conjunction with the accompanying drawings, where.

DETAILED DESCRIPTION OF THE PREFERRED EMBODIMENTS

Figure 1:
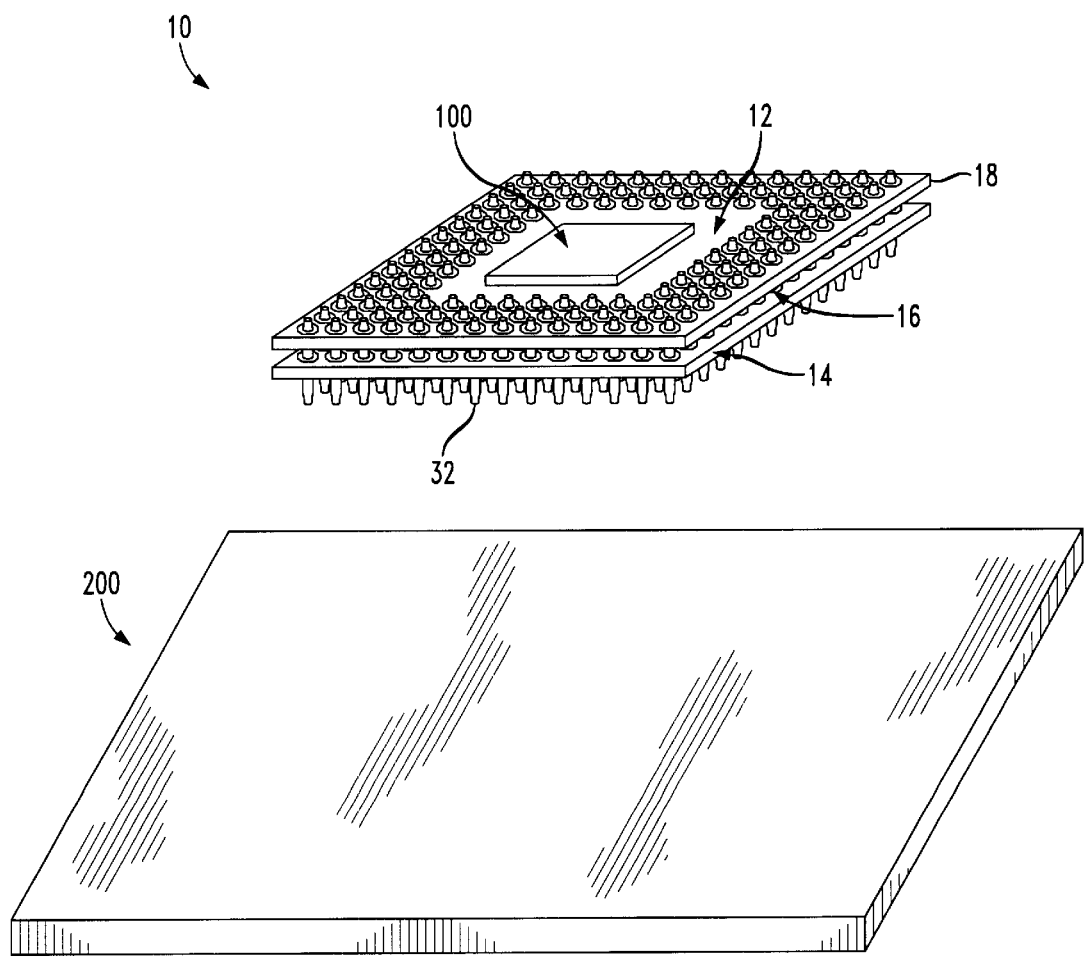
FIG. 1 is a perspective view of an integrated circuit (IC) chip replacement device having an IC chip mounted thereon according to the present invention.

FIG. 1 is a perspective view of an integrated circuit (IC) chip replacement device according to of the present invention and designated generally by reference numeral 10. The IC chip replacement device 10 structurally and electrically interfaces an IC chip 100 to a printed circuit board (PCB) 200, where the PCB 200 is designed to be fitted with another IC chip ("original IC chip") having a different structural configuration and/or electrical operating characteristics than the IC chip 100. Accordingly, the device 10 provides structural and electrical interfaces which are substantially identical to structural and electrical interfaces between the PCB 200 and the original IC chip.

Figure 2:
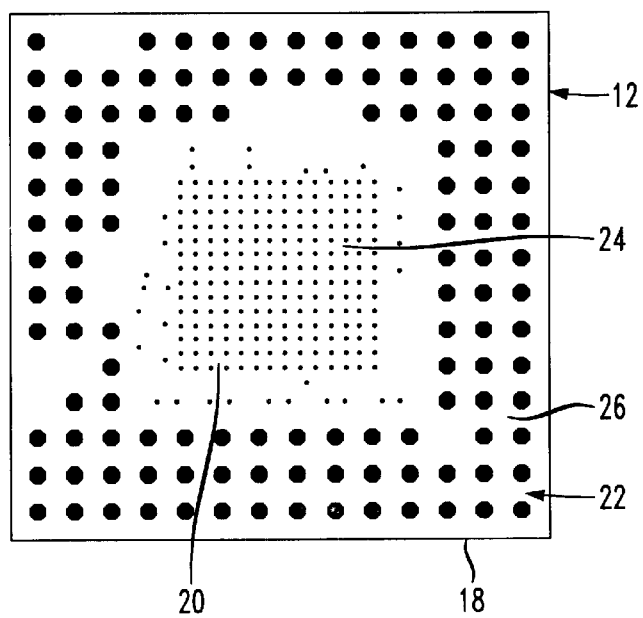
FIG. 2 is a top plan view of an IC chip carrier assembly of the present invention.

The IC chip replacement device 10 includes an IC chip carrier assembly 12, a connector pin body assembly 14, and an electrical circuit 16. As shown by FIG. 2, the IC chip carrier assembly 12 includes a planar body 18 having a top surface and a bottom surface. The IC chip carrier assembly 12 is a multi-layer printed wiring board having blind and buried vias, as known in the art. The top surface includes a central region 20 and an outer region 22. The central region 20 includes an array of drilled land patterns or vias 24 in order to solder the IC chip 100 to the IC chip carrier assembly 12. During fabrication, the drill depth of the land patterns 24 is controlled to prevent drilling through the entire thickness of the IC chip carrier assembly 12.

Figure 3:
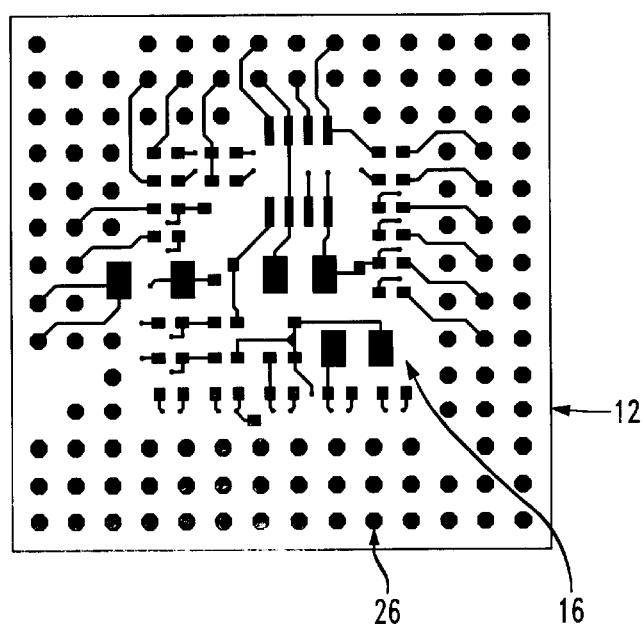
FIG. 3 is a bottom plan view of the IC chip carrier assembly of FIG. 2.

The outer region 22 also includes an array of drilled land patterns 26 for soldering the IC chip carrier assembly 12 to the connector pin body assembly 14 and to the electrical circuit 16 (see FIG. 3). As shown by FIG. 3, the electrical circuit 16 is conformed to an area inside the array of drilled land patterns 26. Several components of the electrical circuit 16 are connected to the array of drilled land patterns 26 by conventional soldering techniques.

The drilled vias of the IC chip carrier assembly 12 allow connection of the array of drilled land patterns 24 to the array of drilled land patterns 26 via additional land patterns on the internal layers of the multilayer IC chip carrier assembly 12. Accordingly, one or more electrical connections are made between the electrical circuit 16 on the bottom surface of the IC chip carrier assembly 12 and the IC chip 100 on the top surface of the IC chip carrier assembly 12 via the blind and buried vias.

The main function of the electrical circuit 16 is to provide an equivalent electrical response between the PCB 200 and the IC chip 100, as the electrical response provided between the PCB 200 and the original IC chip. For example, the electrical circuit 16 may include a voltage regulator circuit, as known in the art, for increasing or decreasing the supply or operating voltage provided to the IC chip 100 via the PCB 200.

It is contemplated that additional circuitry may be soldered to the bottom surface of the IC chip carrier assembly 12 via the drilled land patterns 26. It is further contemplated that the components attached to the top and bottom surfaces of the IC chip carrier assembly 12 can be assembled using conventional solderpaste and reflow techniques as known in the art.

After the IC chip 100 has been attached to the top surface of the IC chip carrier assembly 12 and the electrical circuit 16 has been attached to the bottom surface of the IC chip carrier assembly 12, the IC chip carrier assembly 12 is attached to the connector pin body assembly 14 as described below.

Figure 4:
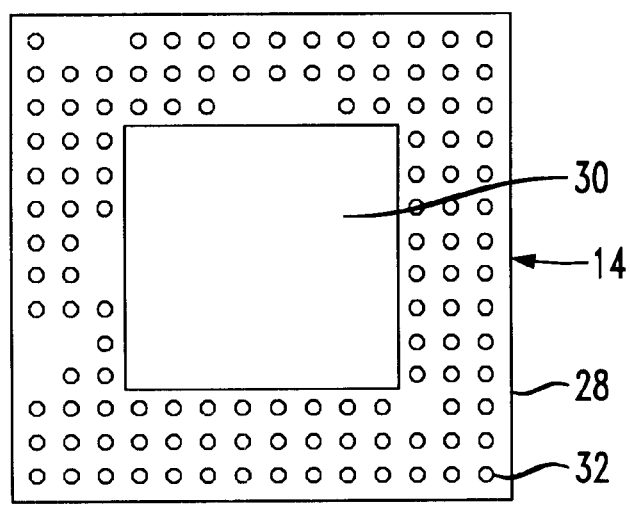
FIG. 4 is a top plan view of a connector pin body assembly of the present invention.

With reference to FIG. 4, the connector pin body assembly 14 includes a planar body 28 having an opening 30 in a central region thereof. The opening 30 provides access to the electrical circuit 16 on the bottom surface of the IC chip carrier assembly 12 for inspection and diagnostic purposes when the IC chip carrier assembly 12 is connected to the connector pin body assembly 14. The planar body 28 further includes top and bottom surfaces having connector pins 32 protruding therefrom.

During assembly of the IC chip replacement device 10, the top ends of the connector pins 32 are extended through the array of land patterns 26 and are soldered to the IC chip carrier assembly 12 via conventional soldering techniques to attach the IC chip carrier assembly 12 to the connector pin body assembly 14. The blind and buried vias of the IC chip carrier assembly 12 provide for one or more electrical connections to be made between the connector pins 32 of the connector pin body assembly 14 and the IC chip carrier assembly 12, the electrical circuit 16 and the IC chip 100. The bottom ends of the connector pins 32 are used to connect, preferably, by conventional soldering techniques, the assembled IC chip replacement device 10 to the PCB 200.

Figure 5:
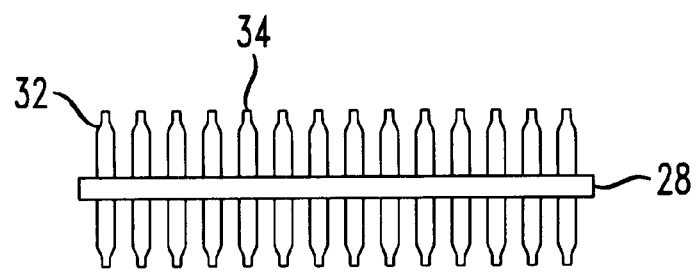
FIG. 5 is a side view of the connector pin body assembly of FIG. 4.

As shown by FIG. 5, the connector pins 32 extend through the planar body 28 in a substantially vertical direction and supported at a midpoint by the planar body 28. A shoulder configuration 34 is provided at the top and bottom end of each connector pin 32 for supporting the IC chip carrier assembly 12 above the PCB 200. The connector pins 32 match a mechanical and structural connecting pin layout of the original IC chip.

It is contemplated to include several voided pin locations where connector pins 30 could have been located which may reflect unused pins in the original IC chip being replaced by the IC chip 100 to reduce cost.

After the IC chip replacement device 10 is connected to the PCB 200, the IC chip replacement device 10 provides a structural and electrical interface between the IC chip 100 mounted on the replacement device 10 and the PCB 200. It is contemplated that the size and shape of the IC chip replacement device 10 is properly configured to match the size and shape of the void left after removing the original IC chip from the PCB 200. Accordingly, the IC chip replacement device 10 provides a proper structural interface between the IC chip 100 and the PCB 200. Additionally, the voltage regulator circuit 16 and associated circuitry of the IC chip replacement device 10 produce an equivalent electrical response between the IC chip 100 and the PCB 200, as the original IC chip and the PCB 200, during operation of the IC chip 100.

In one specific example, the IC chip replacement device 10 of the present invention provides both a structural and electrical interface for replacing a pin grid array IC chip with a ball grid array IC chip on a PCB designed for use with the pin grid array IC chip. That is, in FIG. 1, the IC chip 100 is a ball grid array IC chip. To accommodate the different supply or operating voltage levels of the two IC chips, the electrical circuit 16 of the IC chip replacement device is provided with an auxiliary, lower voltage power supply to allow the ball grid array IC chip to operate at the same voltage level as the pin grid array IC chip when the ball grid array IC chip is mounted on the PCB.

Other types of IC chips that could be replaced with the IC chip replacement device 10 of the present invention include, but are not limited to, memory chips, such as RAM, ROM, charge-coupled device (CCD), and logic array chips, and microprocessor chips.

While the invention is susceptible to various modifications and alternative forms, specific embodiments thereof have been shown by way of example in the drawings and have been described in detail. It should be understood, however, that it is not intended to limit the invention to the particular forms disclosed, but on the contrary, the intention is to cover all modifications, equivalents and alternatives falling within the spirit and scope of the appended claims.

What is claimed is:

1. A device for providing structural and electrical interfaces between a first integrated circuit (IC) chip and a printed circuit board (PCB) designed for use with a second IC chip, said device comprising:

electrical means for providing the electrical interface between said first IC chip and said PCB, said electrical means for producing an electrical response equivalent to an electrical response provided between said PCB and said second IC chip, wherein said electrical means include vias and a voltage pumping circuit for increasing an operating voltage of said first IC chip to a voltage level equivalent to an operating voltage of said second IC chip; and structural means for providing the structural interface between said first IC chip and said PCB;

wherein the structural and electrical interfaces are equivalent to structural and electrical interfaces between the PCB and the second IC chip.

2. The device according to claim 1, wherein said structural means comprises a connector pin body assembly having a plurality of connector pins extending axially therethrough and supported about an axial midpoint by a planar body being perpendicular to an axis of each of said plurality of connector pins, said plurality of connector pins configured to mate with said PCB.

3. The device according to claim 2, wherein at least one end of each connector pin includes a shoulder configuration.

4. The device according to claim 2, wherein said connector pin body assembly is configured to support said device at a predetermined distance above said PCB for providing a vertical separation between said device and said PCB.

5. The device according to claim 2, wherein said structural means further comprises an IC chip carrier assembly having a planar body.

6. The device according to claim 5, wherein said planar body of said IC chip carrier assembly includes a central region and an outer region, where said central region includes means for receiving said first IC chip and said outer region includes means for connecting said IC chip carrier assembly with said connector pin body assembly.

7. The device according to claim 5, wherein said electrical means is provided on a bottom planar surface of said IC chip carrier assembly.

8. The device according to claim 6, wherein said means for receiving said first IC chip includes at least a group of the vias as an array of drilled land patterns.

9. The device according to claim 6, wherein said means for connecting said IC chip carrier assembly with said connector pin body assembly includes an array of drilled land patterns.

10. The device according to claim 6, wherein said connector pin body assembly is connected to said IC chip carrier assembly by soldering.

11. The device according to claim 6, wherein said means for receiving said first IC chip and said means for connecting said IC chip carrier assembly with said connector pin body assembly are connected via the vias within said IC chip carrier assembly.

12. The device according to claim 2, wherein each of said plurality of connector pins is configured for connecting to said PCB.

13. The device according to claim 2, wherein said connector pin body assembly includes an opening in a central region thereof.

14. A device for providing structural and electrical interfaces between a first integrated circuit (IC) chip and a printed circuit board (PCB) designed for use with a second IC chip, said device comprising:

an electrical circuit for providing the electrical interface between said first IC chip and said PCB, said electrical circuit producing an electrical response equivalent to an electrical response provided between said PCB and said second IC chip, wherein said electrical circuit includes vias and a voltage pumping circuit for increasing an operating voltage of said first IC chip to a voltage level equivalent to an operating voltage of said second IC chip; and a structural assembly for providing the structural interface between said first IC chip and said PCB;

wherein the structural and electrical interfaces are equivalent to structural and electrical interfaces between the PCB and the second IC chip.

15. The device according to claim 14, wherein said structural assembly comprises a connector pin body assembly having a plurality of connector pins extending axially therethrough and supported about an axial midpoint by a planar body being perpendicular to an axis of each of said plurality of connector pins, said plurality of connector pins configured to mate with said PCB.

16. The device according to claim 15, wherein at least one end of each connector pin includes a shoulder configuration.

17. The device according to claim 15, wherein said connector pin body assembly is configured to support said device at a predetermined distance above said PCB for providing a vertical separation between said device and said PCB.

18. The device according to claim 15, wherein said structural assembly further comprises an IC chip carrier assembly having a planar body.

19. The device according to claim 18, wherein said planar body of said IC chip carrier assembly includes a central region and an outer region, where said central region includes means for receiving said first IC chip and said outer region includes means for connecting said IC chip carrier assembly with said connector pin body assembly.

20. The device according to claim 18, wherein said electrical means is provided on a bottom planar surface of said IC chip carrier assembly.

21. The device according to claim 19, wherein said means for receiving said first IC chip includes at least a group of the vias as an array of drilled land patterns.

22. The device according to claim 19, wherein said means for connecting said IC chip carrier assembly with said connector pin body assembly includes an array of drilled land patterns.

23. The device according to claim 19, wherein said connector pin body assembly is connected to said IC chip carrier assembly by soldering.

24. The device according to claim 19, wherein said means for receiving said first IC chip and said means for connecting said IC chip carrier assembly with said connector pin body assembly are connected via the vias within said IC chip carrier assembly.

25. The device according to claim 15, wherein each of said plurality of connector pins is configured for connecting to said PCB.

26. The device according to claim 15, wherein said connector pin body assembly includes an opening in a central region thereof.

27. A device for providing structural and electrical interfaces between a first integrated circuit (IC) chip and a printed circuit board (PCB) designed for use with a second IC chip, said device comprising:

electrical means for providing the electrical interface between said first IC chip and said PCB, said electrical means for producing an electrical response equivalent to an electrical response provided between said PCB and said second IC chip, wherein said electrical means include vias; and structural means for providing the structural interface between said first IC chip and said PCB, wherein said structural means comprises a connector pin body assembly having a plurality of connector pins extending axially therethrough and supported about an axial midpoint by a planar body being perpendicular to an axis of each of said plurality of connector pins, said plurality of connector pins configured to mate with said PCB;

wherein the structural and electrical interfaces are equivalent to structural and electrical interfaces between the PCB and the second IC chip.

28. A device for providing structural and electrical interfaces between a first integrated circuit (IC) chip and a printed circuit board (PCB) designed for use with a second IC chip, said device comprising:

an electrical circuit for providing the electrical interface between said first IC chip and said PCB, said electrical circuit producing an electrical response equivalent to an electrical response provided between said PCB and said second IC chip, wherein said electrical circuit includes vias; and a structural assembly for providing the structural interface between said first IC chip and said PCB, wherein said structural assembly comprises a connector pin body assembly having a plurality of connector pins extending axially therethrough and supported about an axial midpoint by a planar body being perpendicular to an axis of each of said plurality of connector pins, said plurality of connector pins configured to mate with said PCB;

wherein the structural and electrical interfaces are equivalent to structural and electrical interfaces between the PCB and the second IC chip.

* * * * *